United States Patent
Yang et al.

(10) Patent No.: US 11,257,849 B2
(45) Date of Patent: Feb. 22, 2022

(54) DISPLAY PANEL AND METHOD FOR FABRICATING THE SAME

(71) Applicant: BOE Technology Group Co., Ltd., Beijing (CN)

(72) Inventors: Wei Yang, Beijing (CN); Guangcai Yuan, Beijing (CN); Ce Ning, Beijing (CN); Xinhong Lu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 29 days.

(21) Appl. No.: 16/531,231

(22) Filed: Aug. 5, 2019

(65) Prior Publication Data
US 2020/0066758 A1 Feb. 27, 2020

(30) Foreign Application Priority Data
Aug. 24, 2018 (CN) .......................... 201810974479.7

(51) Int. Cl.
*H01L 29/10* (2006.01)
*H01L 27/12* (2006.01)

(52) U.S. Cl.
CPC .......... *H01L 27/124* (2013.01); *H01L 27/127* (2013.01); *H01L 27/1218* (2013.01); *H01L 27/1225* (2013.01)

(58) Field of Classification Search
None
See application file for complete search history.

(56) References Cited

U.S. PATENT DOCUMENTS

| | | | |
|---|---|---|---|
| 2015/0123084 A1* | 5/2015 | Kim | H01L 27/326 257/40 |
| 2015/0171224 A1* | 6/2015 | Liu | H01L 29/6675 257/72 |
| 2015/0295094 A1 | 10/2015 | Ren et al. | |
| 2016/0035805 A1* | 2/2016 | Kim | G09G 3/3225 345/76 |

(Continued)

FOREIGN PATENT DOCUMENTS

| CN | 102790096 A | 11/2012 |
|---|---|---|
| CN | 103258745 A | 8/2013 |

(Continued)

OTHER PUBLICATIONS

Chinese Office Action for corresponding application 201810974479.7 dated Mar. 24, 2020.

*Primary Examiner* — Hung K Vu
(74) *Attorney, Agent, or Firm* — Arent Fox LLP; Michael Fainberg

(57) ABSTRACT

A display panel and a method for fabricating the same are provided. The display panel includes: a base substrate; a first thin film transistor on one side of the base substrate, the first thin film transistor comprising: a first active layer, a first protection layer, a second protection layer, a first source and a first drain; wherein the first protection layer and the second protection layer are on one side of the first active layer away from the base substrate, and are separated from each other; the first protection layer and the second protection layer are configured to protect the first active layer from being etched during forming of a via-hole corresponding to the first source and/or a via-hole corresponding to the first drain.

18 Claims, 5 Drawing Sheets

(56) References Cited

U.S. PATENT DOCUMENTS

2016/0372497 A1* 12/2016 Lee .................... H01L 27/1222
2019/0027612 A1   1/2019 Zhang et al.

FOREIGN PATENT DOCUMENTS

| CN | 105609567 | A | 5/2016 |
| CN | 107808826 | A | 3/2018 |
| CN | 108231671 | A | 6/2018 |
| CN | 108288621 | A | 7/2018 |
| CN | 208848909 | U | 5/2019 |
| JP | 07183526  | A | 7/1995 |

* cited by examiner

DISPLAY PANEL AND METHOD FOR FABRICATING THE SAME

CROSS-REFERENCES TO RELATED APPLICATION

This application claims priority to Chinese patent application No. 201810974479.7 filed on Aug. 24, 2018, which is incorporated herein by reference in its entirety.

FIELD

The present disclosure relates to the field of display technologies, and particularly to a display panel and a method for fabricating the same.

BACKGROUND

In recent years, the Low Temperature Poly-Silicon (LTPS) semiconductor and the metal oxide semiconductor have been widely favored in the industry of displays, and have their respective advantages and are equivalently competitive. The LTPS semiconductor has a high mobility, and can be charged rapidly, and the metal oxide semiconductor has low leakage current. If there is an LTPS plus Oxide (LTPO) product with the advantages of these two materials, then a user experience of the display product will be greatly improved. However, LTPS and metal oxide fabrication processes are greatly different from each other, that is, the processes are less compatible with each other, so that it is difficult to guarantee their stability; and a LTPS plus Oxide process is so complicated that a large number of masks are necessary, thus resulting in a high cost of the product. Accordingly it is highly desirable to reduce the number of masks while guaranteeing the stability of the LTPS plus Oxide process.

SUMMARY

In one aspect, an embodiment of the disclosure provides a display panel. The display panel includes: a base substrate, a first thin film transistor on one side of the base substrate, the first thin film transistor including: a first active layer, a first protection layer, a second protection layer, a first source and a first drain; wherein the first protection layer and the second protection layer are on one side of the first active layer away from the base substrate, and are separated from each other; the first protection layer and the second protection layer are configured to protect the first active layer from being etched during forming of a via-hole corresponding to the first source and/or a via-hole corresponding to the first drain.

In some embodiments, the display panel further includes: a first gate insulation layer on the side of the first active layer away from the base substrate, the first gate insulation layer being between the first protection layer and the second protection layer, and separated from the first protection layer and the second protection layer; a first gate on one side of the first gate insulation layer away from the base substrate and being electrically insulated from the first protection layer and the second protection layer.

In some embodiments, the display panel further includes: a first insulation layer between the first active layer and the base substrate; a first electrode on one side of the first insulation away from the base substrate and in a same layer as the first protection layer and the second protection layer; a second electrode on one side of the first electrode away from the base substrate; wherein the first electrode and the second electrode are configured to be two electrodes of a pixel capacitor in a pixel circuit.

In some embodiments, in the display panel, material of the first electrode is same as material of the first protection layer and the second protection layer.

In some embodiments, in the display panel, material of the second electrode is same as material of the first gate.

In some embodiments, the display panel further includes a third insulation layer between the first electrode and the second electrode; wherein material of the third insulation is same as material of the first gate insulation layer.

In some embodiments, the display panel further includes: a second thin film transistor on the side of the base substrate having the first thin film transistor, the second thin film transistor comprising a second gate; wherein an orthographic projection of the first electrode on the base substrate at least partially overlaps with an orthographic projection of the second gate on the base substrate; or an orthographic projection of the second electrode on the base substrate at least partially overlaps with the orthographic projection of the second gate on the base substrate.

In some embodiments, in the display panel, the orthographic projection of the second gate on the base substrate is within the orthographic projection of the first electrode on the base substrate; and the orthographic projection of the second gate on the base substrate is within the orthographic projection of the second electrode on the base substrate.

In some embodiments, in the display panel, the orthographic projection of the first electrode and the orthographic projection of the second electrode on the base substrate completely overlap with each other.

In some embodiments, the display panel further includes: a second insulation layer on one side of the first insulation layer away from the base substrate; and a first via-hole in the second insulation layer; wherein the first protection layer is electrically connected with the first source through the first via-hole.

In some embodiments, the display panel further includes: a second via-hole in the second insulation layer, wherein the second protection layer is electrically connected with the first drain through the second via-hole.

In some embodiments, the display panel further includes: a second insulation layer on one side of the first insulation layer away from the base substrate, and the second thin film transistor further includes: a second active layer, a second source, a second drain, and a third via-hole in the first insulation layer and the second insulation layer, wherein the second active layer is electrically connected with the second source of the second thin film transistor through the third via-hole.

In some embodiments, the display panel further includes: a fourth via-hole in the first insulation layer and the second insulation layer, wherein the second active layer is electrically connected with the second drain of the second thin film transistor through the fourth via-hole.

In some embodiments, in the display panel, the first protection layer and the second protection are metal layers.

In some embodiments, in the display panel, the first active layer is a semiconductor oxide layer.

In another aspect, an embodiment of the disclosure provides a method for fabricating a display panel. The method includes: forming a first insulation layer on one side of the base substrate; forming a first active layer of a first thin film transistor on the first active layer, and forming a first protection layer and a second protection layer on the first active layer, wherein the first protection layer and the second protection layer are separated from each other, and are configured to protect the first active layer from being etched during forming of a via-hole corresponding to a first source of the first thin film transistor and/or a via-hole corresponding to a first drain of the first thin film transistor.

In some embodiments, before forming the first insulation layer on one side of the base substrate, the method further includes: forming a pattern of a poly-silicon layer on the base substrate to form the second active layer of a second thin film transistor; forming the first insulation layer on the poly-silicon layer. After forming the first protection layer and the second protection layer, the method further includes: forming a second insulation layer on the first protection layer and the second protection layer; patterning the first insulation layer and the second insulation layer in one patterning process to form a first via-hole and a second via-hole running through the second insulation layer and a third via-hole and a fourth via-hole running through the first insulation layer and the second insulation layer; forming a pattern of the source-drain electrode layer on the second insulation layer to form a first source and a first drain of the first thin film transistor, and a second source and a second drain of the second thin film transistor, wherein the first source and the first drain are electrically connected with the first protection layer and the second protection layer respectively through the first via-hole and the second via-hole, the second source and the second drain are electrically connected with the second active layer respectively through the third via-hole and the fourth via-hole.

In some embodiments, the method further includes: forming a first electrode in a same patterning process as the first protection layer and the second protection layer.

In some embodiments, the method further includes: forming a first gate insulation layer of the first thin film transistor on the first active layer, wherein the first gate insulation layer is between the first protection layer and the second protection layer, and separated from the first protection layer and the second protection layer, forming a third insulation layer on the first electrode at same time when forming the first gate insulation layer, wherein the third insulation layer and the first gate insulation layer are formed in one patterning process; forming a first gate of the first thin film transistor on the first gate insulation layer, and forming a second electrode on the third insulation layer, wherein the first gate and the second electrode are formed in one patterning process.

In some embodiments, forming the first active layer of a first thin film transistor on the first active layer and forming the first protection layer and the second protection layer on the first active layer includes: forming a semiconductor oxide layer on the first insulation layer, and forming a first metal layer on the semiconductor oxide layer; patterning the semiconductor oxide layer and the first metal layer in one patterning process to form the first active layer of the first thin transistor and the first protection layer and the second protection layer on the first active layer.

DETAILED DESCRIPTION

Figure 1:
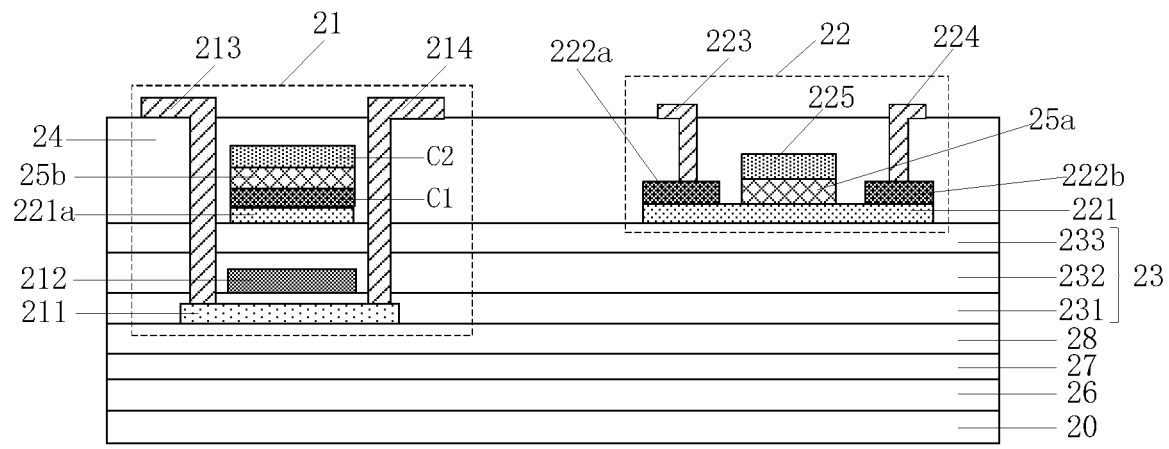
FIG. 1 is a schematic structural diagram of a display panel according to an embodiment of the disclosure.

In view of the problem in the related art of a large number of masks for the LTPO product, the embodiments of the disclosure provide a display panel and a method for fabricating the display panel.

Implementations of the display panel, the method for fabricating the display panel according to the embodiments of the disclosure will be described below in details with reference to the drawings. The thicknesses and shapes of respective layers in the drawings will not reflect any real proportion, but are only intended to illustrate the content of the disclosure.

In one aspect, an embodiment of the disclosure provides a display panel. As illustrated in FIG. 1, the display panel includes: a base substrate 20, a first thin film transistor 22 on one side of the base substrate 20, the first thin film transistor 22 including: a first active layer 221, a first protection layer 222a, a second protection layer 222b, a first source 223 and a first drain 224; wherein the first protection layer 222a and the second protection layer 222b are on one side of the first active layer 221 away from the base substrate 20, and are separated from each other; the first protection layer 222a and the second protection layer 222b are configured to protect the first active layer 221 from being etched during forming of a via-hole corresponding to the first source 223 and/or a via-hole corresponding to the first drain 224.

In the display panel according to the embodiment of the disclosure, the first protection layer and the second protection layer are formed on the positions of the first active layer to be connected with the first source and first drain, thus during forming the via holes corresponding to first source and/or first drain of the first thin film transistor by etching, the first active layer can be protected from being etched, thus there is no damage occurs on the first active layer during forming of the via-holes.

In some embodiments, as illustrated in FIG. 1, the first thin film transistor 22 of the display panel further includes: a first gate insulation layer 25a on the side of the first active layer 221 away from the base substrate 20, the first gate insulation layer 25a being between the first protection layer 222a and the second protection layer 222b, and separated from the first protection layer 222a and the second protection layer 222b; a first gate 225 on one side of the first gate insulation layer 25a away from the base substrate 20 and being electrically insulated from the first protection layer 222a and the second protection layer 222b.

In some embodiments, as illustrated in FIG. 1, the display panel further includes: a first insulation layer 23, between the first active layer 221 and the base substrate 20. In some embodiments, the first insulation layer 23 can include a plurality of insulation layers, and for example, the first insulation layer 23 can include a gate insulation layer 231, an interlayer insulation layer 232, and a first buffer layer 233, although the first insulation layer 23 will not be limited to any specific structure.

In some embodiments, the display panel further includes: a first electrode C1 on one side of the first insulation layer away from the base substrate and in a same layer as the first protection layer 222a and the second protection layer 222b; a second electrode C2 on one side of the first electrode C1 away from the base substrate 20. The first electrode C1 and the second electrode C2 are configured to be two electrodes of a pixel capacitor in a pixel circuit.

As used herein, the term "same layer" refers to the relationship between the layers simultaneously formed in the same step. In one example, the first electrode C1 and the first and second protection layer 222a, 222b are in a same layer when they are formed as a result of one or more steps of a same patterning process performed in a same layer of material. In another example, the first electrode C1 and the first and second protection layer 222a, 222b can be formed in a same layer by simultaneously performing the step of forming the first electrode C1 and the step of forming the first protection layer 222a and 222b. The term "same layer" does not always mean that the thickness of the layer or the height of the layer in a cross-sectional view is the same.

In some embodiments, the first electrode C1 can be formed in a same patterning process as the first protection layer 222a and the second protection layer 222b, that is, material of the first electrode C1 is the same as material of the first protection layer 222a and second protection layer 222b. The second electrode C2 can be formed in a same patterning process as the first gate 225 of the first thin film transistor 22, that is, the material of the first gate 225 is the same as the material of the second electrode C2. In this way, the fabricating process can be lowered, and the fabricating cost can be reduced.

As used in herein, the term "patterning process" is a preparation process including one or more following steps to form the some film, layer or component: depositing, coating photoresist, mask exposure, developing, etching, stripping photoresist, etc., which is a mature preparation process in the related art. Depositing, coating, mask exposure, developing, etching and stripping photoresist are known to those skilled, and is not limited herein.

In some embodiments, as illustrated in FIG. 1, the display panel further includes a third insulation layer 25b between the first electrode C1 and the second electrode C2. Optionally, the third insulation layer 25b and the first gate insulation layer 25a of the first thin film transistor 22 can be formed in one patterning process, that is, the material of the third insulation layer 25b is the same as the material of the first gate insulation layer 25a of the first thin film transistor 22.

Specifically, the orthographic projection of the first electrode C1 on the base substrate overlaps with the orthographic projection of the second electrode C2 on the base substrate, so the first electrode C1 and the second electrode C2 constitute a capacitor structure. Since there is only one insulation layer (i.e., the third insulation layer 25b) between the first electrode C1 and the second electrode C2, where the thickness of the third insulation layer 25b only ranges from 1000Å to 1500Å, that is, there is a short distance between the first electrode C1 and the second electrode C2, there is a large capacitance of the constituted capacitor structure. In a real application, the capacitor structure can be a pixel capacitor in a pixel circuit, and the pixel capacitor is formed as the capacitor structure with the large capacitance so that a Driving Thin Film Transistor (DTFT) connected with the pixel capacitor can be so highly reliable that the potential at a gate of the DTFT transistor can drop slowly in a pixel light-emission period to thereby alleviate flicking on the display panel. In a real application, the third insulation layer above can be made of an SiO material, although the third insulation will not be limited to any particular material. In order to save a space, and to avoid any other signal line from being affected, the capacitor structure constituted of the first electrode C1 and the second electrode C2 is optionally located at the position of the second thin film transistor.

In some embodiments, as illustrated in FIG. 1, the display panel further includes: a second thin film transistor 21 on the side of the base substrate 20 having the first thin film transistor 22, the second thin film transistor 21 including a second gate 212. The orthographic projection of the first electrode C1 on the base substrate 20 at least partially overlaps with an orthographic projection of the second gate 212 on the base substrate 20; or an orthographic projection of the second electrode C2 on the base substrate 20 at least partially overlaps with the orthographic projection of the second gate 212 on the base substrate 20.

In some embodiments, in the display panel, the orthographic projection of the second gate 212 on the base substrate 20 is within the orthographic projection of the first electrode C1 on the base substrate 20; and the orthographic projection of the second gate 212 on the base substrate 20 is within the orthographic projection of the second electrode C2 on the base substrate 20.

Figure 2:
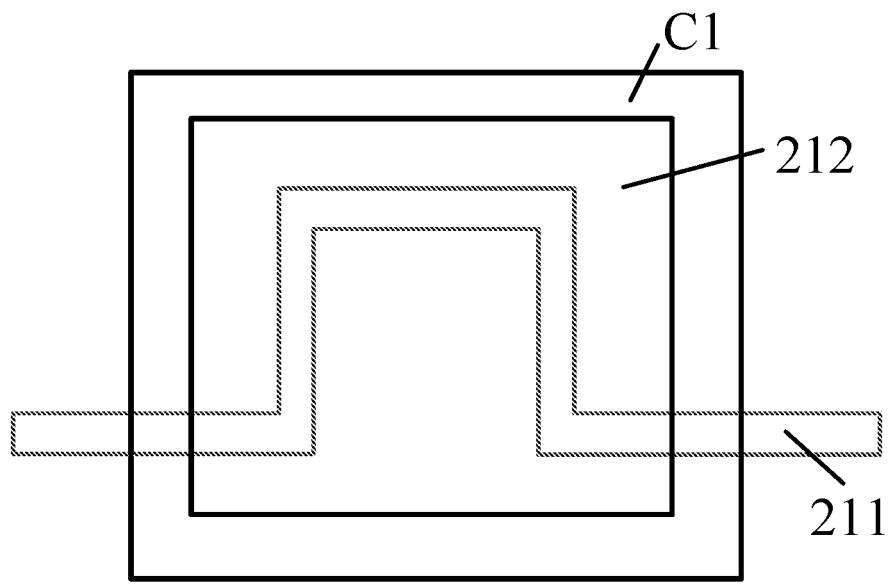
FIG. 2 is a top view of the display panel of FIG. 1 at the position of second thin film transistor.

FIG. 2 shows a top view of the display panel of FIG. 1 at the position of second thin film transistor. In some embodiments, the second electrode C2 is directly above the first electrode C1, the area of the second electrode C2 is about the same as the area of the first electrode C1, that is, the orthographic projection of the second electrode C2 on the base substrate 20 almost completely overlaps with the orthographic projection of the first electrode C1 on the base substrate 20. In some embodiments, the area of the first electrode C1 can be larger than that of the second gate 212, thus the pixel capacitance can be increased. In other embodiments, the area of the first electrode C1 can be smaller than that of the second gate as long as the pixel capacitance meets the design requirements.

In some embodiments, the third insulation layer 25b and the second electrode C2 can be formed in one patterning process, thus the area of the third insulation layer 25b can be the same as the area of the second electrode C2. In other embodiments, the first semiconductor oxide layer 221a and the first electrode C1 can be formed in one patterning process, thus the area of the first semiconductor oxide layer 221a is the same as the area of the first electrode C1.

In some embodiments, as illustrated in FIG. 1, the display panel further includes: a second insulation layer 24 on one side of the first insulation layer 23 away from the base substrate 20; and a first via-hole and/or a second via-hole in the second insulation layer; wherein the first protection layer 222a is electrically connected with the first source 223 through the first via-hole, the second protection layer 222b is electrically connected with the first drain 224 through the second via-hole.

In some embodiments, as illustrated in FIG. 1, the second thin film transistor 21 of the display panel further includes: a second active layer 211, a second source 213, a second drain 214. The second source 213 is electrically connected with the second active layer 211 by a third via-hole running through the first insulation layer 23 and the second insulation layer 24, the second drain 214 is electrically connected with the second active layer 211 by the fourth via-hole running through the first insulation layer 23 and the second insulation layer 24.

In some embodiments, in the display panel, the first protection layer and the second protection are made of metal material, so the first and second protection layers made of the metal material cannot be etched by etching solution or an etching device for etching the insulation layer so that the first active layer 221 can be protected from being damaged.

Further since the first and second protection layers are made of the metal material with a high electrical-conductivity, the first source 223 and the first drain 224 can be well electrically connected with the first active layer 221.

In some embodiments, the first active layer 221 is an semiconductor oxide layer. The first active layer 221 is in the same layer as the first semiconductor oxide layer 221a, and is made of the same material as the first semiconductor oxide layer 221a, the material of which can be an indium gallium zinc oxide (IGZO), indium tin zinc oxide (ITZO), indium gallium zinc tin oxide (IGTO) or zinc oxide (ZnO) material. Alternatively the semiconductor oxide layer can be made of another metal oxide semiconductor material, and for example, some other component can be added to the IGZO material to form the semiconductor oxide layer in an IGZXO structure to thereby improve the mobility of carriers, although the semiconductor oxide layer will not be limited to any specific material.

In another aspect, an embodiment of the disclosure provides a method for fabricating a display panel. The method includes: forming a first insulation layer on one side of the base substrate; forming a first active layer of a first thin film transistor on the first active layer, and forming a first protection layer and a second protection layer on the first active layer, wherein the first protection layer and the second protection layer are separated from each other, and are configured to protect the first active layer from being etched during forming of a via-hole corresponding to a first source of the first thin film transistor and/or a via-hole corresponding to a first drain of the first thin film transistor.

In some embodiments, before forming the first insulation layer on one side of the base substrate, the method further includes: forming a pattern of a poly-silicon layer on the base substrate to form the second active layer of a second thin film transistor; forming the first insulation layer on the poly-silicon layer. After forming the first protection layer and the second protection layer, the method further includes: forming a second insulation layer on the first protection layer and the second protection layer; patterning the first insulation layer and the second insulation layer in one patterning process to form a first via-hole and a second via-hole running through the second insulation layer and a third via-hole and a fourth via-hole running through the first insulation layer and the second insulation layer; forming a pattern of the source-drain electrode layer on the second insulation layer to form a first source and a first drain of the first thin film transistor, and a second source and a second drain of the second thin film transistor, wherein the first source and the first drain are electrically connected with the first protection layer and the second protection layer respectively through the first via-hole and the second via-hole, the second source and the second drain are electrically connected with the second active layer respectively through the third via-hole and the fourth via-hole.

With the above method, before the via-holes are formed, the first protection layer and the second protection layer can be formed on the first active layer, so that the first active layer cannot be exposed after the first and the second via-holes are formed, and thus the first active layer cannot be damaged while the first and the second via-holes are being formed, so the first, the second, the third and the fourth via-holes can be formed in one patterning process to thereby dispense with one patterning process. Moreover after the first via-hole, the second via-hole, the third via-hole and the fourth via-hole are formed, the first via-hole and the second via-hole can be rinsed using HF solution without damaging the first active layer which is not exposed, so that the process cost can be lowered while guaranteeing the stability of the process, and the performance of the thin film transistor.

In some embodiments, the method further includes: forming a first electrode in a same patterning process as the first protection layer and the second protection layer.

In some embodiments, the method further includes: forming a first gate insulation layer of the first thin film transistor on the first active layer, wherein the first gate insulation layer is between the first protection layer and the second protection layer, and separated from the first protection layer and the second protection layer, forming a third insulation layer on the first electrode at same time when forming the first gate insulation layer, wherein the third insulation layer and the first gate insulation layer are formed in one patterning process; forming a first gate of the first thin film transistor on the first gate insulation layer, and forming a second electrode on the third insulation layer, wherein the first gate and the second electrode are formed in one patterning process.

With the above method, the number of masks can be reduced, and the fabrication cost of the display panel can be lowered, while guaranteeing the performance of the transistor.

In some embodiments, forming the first active layer of a first thin film transistor on the first active layer and forming the first protection layer and the second protection layer on the first active layer includes: forming a semiconductor oxide layer on the first insulation layer, and forming a first metal layer on the semiconductor oxide layer; patterning the semiconductor oxide layer and the first metal layer in one patterning process to form the first active layer of the first thin transistor and the first protection layer and the second protection layer on the first active layer.

With the above method, the number of masks can be reduced, and the fabrication cost of the display panel can be lowered.

Figure 3:
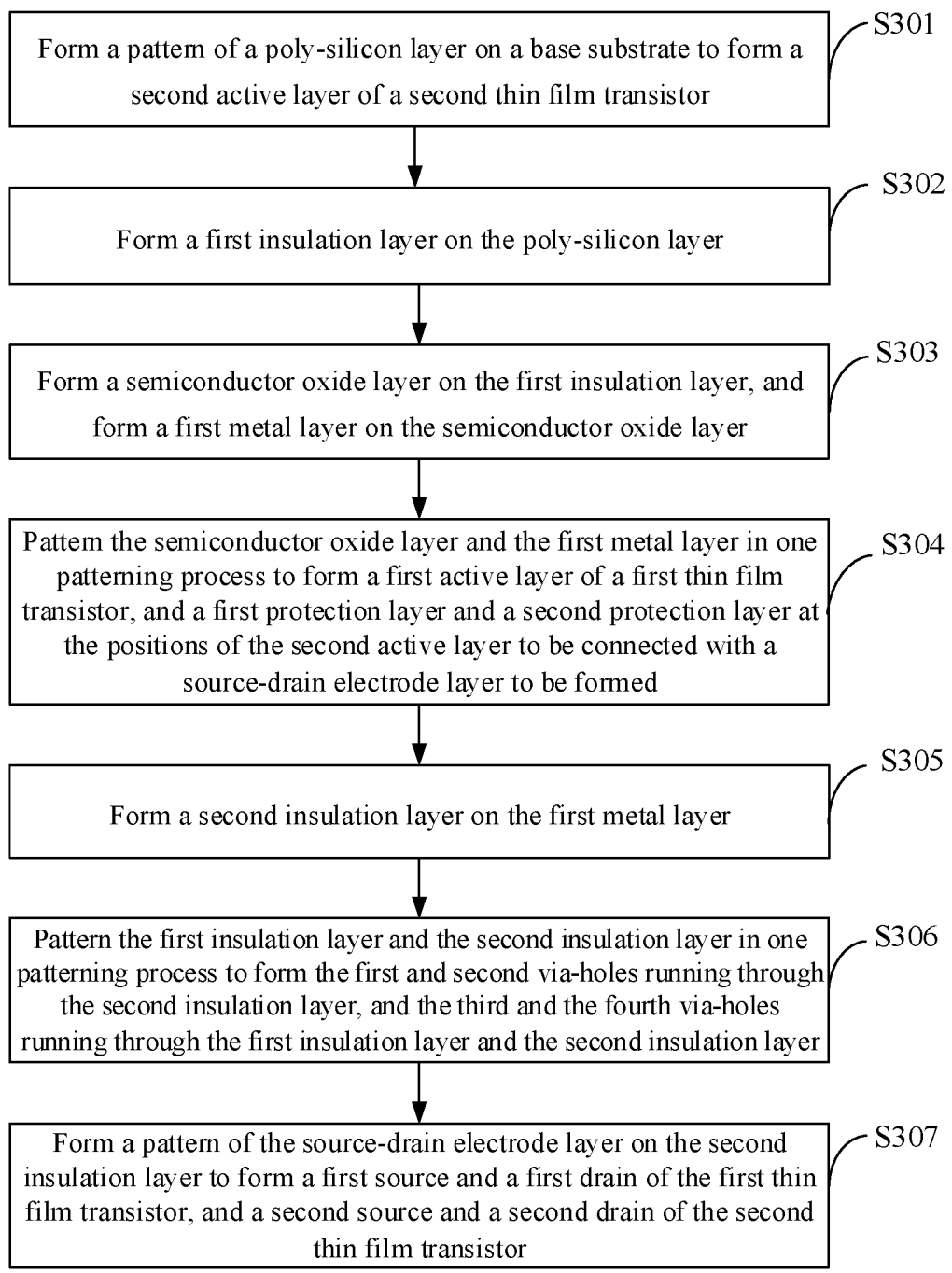
FIG. 3 is a flow chart of a method for fabricating a display panel according to an embodiment of the disclosure.

The method for fabricating the display panel according to the embodiment of the disclosure is further described in detail below with reference to the FIGS. 3 and 4. As illustrated in FIG. 3, the method includes the following steps.

The step S301 is to form a pattern of a poly-silicon layer on a base substrate to form a second active layer of a second thin film transistor.

The step S302 is to form a first insulation layer on the poly-silicon layer.

The step S303 is to form a semiconductor oxide layer on the first insulation layer, and to form a first metal layer on the semiconductor oxide layer.

The step S304 is to pattern the semiconductor oxide layer and the first metal layer in one patterning process to form a first active layer of a first thin film transistor, and a first protection layer and a second protection layer located at the position where the first active layer is to be connected with a source-drain electrode layer to be formed.

The step S305 is to form a second insulation layer on the first metal layer.

The step S306 is to pattern the first insulation layer and the second insulation layer in one patterning process to form a first via-hole and a second via-hole running through the second insulation layer, and a third via-hole and a fourth via-hole running through the first insulation layer and the second insulation layer, where the first via-hole and the second via-hole are configured to connect the first protection layer and the second protection layer with the source-drain electrode layer to be formed, the third via-hole and the fourth via-hole are configured to connect the second active layer with the source-drain electrode layer to be formed, and an orthographic projection of the first via-hole on the base substrate is within an orthographic projection of the first protection layer on the base substrate; and an orthographic projection of the second via-hole on the base substrate is within an orthographic projection of the second protection layer on the base substrate.

The step 307 is to form a pattern of the source-drain electrode layer on the second insulation layer to form a first source and a first drain of the first thin film transistor, and a second source and a second drain of the second thin film transistor.

In the method according to the embodiment of the disclosure, the first protection layer and the second protection layer are formed at the positions where the first active layer is connected with the source-drain electrode layer to be formed, so that the first active layer exposed at the first via-hole and the second via-hole can be protected, and thus the first via-hole, the second via-hole, the third via-hole and the fourth via-hole can be formed in one patterning process to thereby dispense one patterning process; and the first protection layer, the second protection layer and the first active layer can be formed in one patterning process without any additional patterning process so that the number of patterning processes can be reduced, the number of masks can be reduced, and the fabrication cost of the display panel can be lowered, while guaranteeing the stability of the process.

In a real process flow, since the LTPS semiconductor material has a high mobility, and can be charged rapidly, and the metal oxide semiconductor material has low leakage current, these two materials are combined into an LTPO product, thus the LTPO product has the advantages of these two materials, then a user experience of the display product can be greatly improved.

However due to the restriction of the fabrication processes, the active layer made of the LTPS semiconductor material, and the active layer made of the metal oxide semiconductor material can not be located at the same layer, but are spaced by a plurality of insulation layers; and when the via-holes for connecting the active layers with the source-drain electrode layer are formed at different depths, the depth of the via-hole corresponding to the LTPS semiconductor is far larger than the depth of the via-hole corresponding to the metal oxide semiconductor, and when the via-holes of the LTPS semiconductor and the via-holes of the metal oxide semiconductor are formed at the same time, the insulation layers corresponding to the LTPS semiconductor may be further etched after the insulation layers corresponding to the metal oxide semiconductor are etched, that is, the active layer made of the metal oxide semiconductor may be etched for an additional time period until the active layer made of the metal oxide semiconductor is completely etched, thus degrading the characteristic of the thin film transistor. In view of this, it is difficult to form the via-holes of the LTPS semiconductor and the metal oxide semiconductor at the same time.

Moreover after the via-hole is formed, the LTPS thin film transistors may be rinsed using HF solution before the source-drain electrode layer is deposited, to thereby remove an oxide layer on the surface of the active layer so as to form a good ohm contact between the active layer and the source-drain electrode layer, but the metal oxide semiconductor exposed at the via-hole of the metal oxide semiconductor may be damaged by the HF solution, thus further degrading the characteristic of the thin film transistor.

In the embodiment of the disclosure, before the first, second, third and the fourth via-holes are formed, the first protection layer and the second protection layer are formed on the first active layer to protect the first active layer, so that the first active layer cannot be exposed after the first and the second via-holes are formed, and thus the first active layer cannot be damaged while the first and the second via-holes are being formed, so the first, the second, the third and the fourth via-holes can be formed in one patterning process to thereby dispense with one patterning process; and the first protection layer, the second protection layer and the first active layer are formed in one patterning process without increasing the number of patterning processes. Moreover after the first via-hole, the second via-hole, the third via-hole and the fourth via-hole are formed, the first via-hole and the second via-hole can be rinsed using HF solution without damaging the first active layer which is not exposed, so that the number of masks can be reduced, and the process cost can be lowered while guaranteeing the stability of the process, and the performance of the thin film transistor.

Figure 4A:
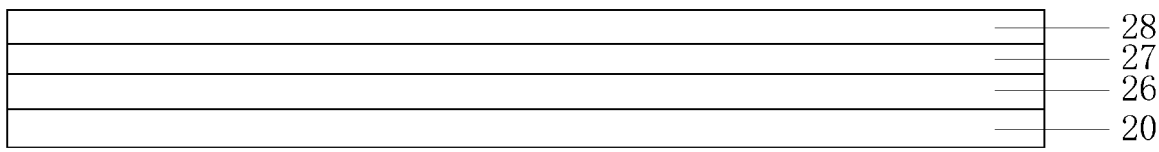
FIG. 4A to FIG. 4I are schematic structural diagrams corresponding to respective steps in the method above according to the embodiment of the disclosure.
Figure 4B:
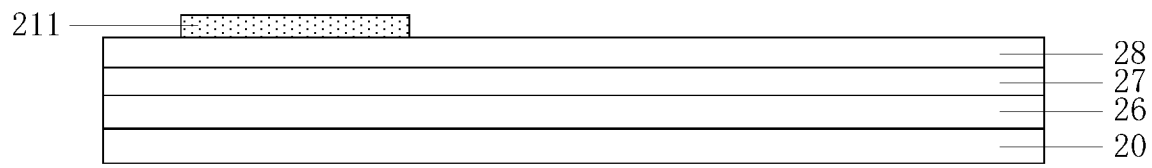

Specifically in the step S301 above, referring to FIG. 4B, the pattern of the poly-silicon layer is formed on the base substrate 20, that is, the poly-silicon layer is made of Poly-Silicon (P-Si), and the poly-silicon layer is patterned to form the second active layer 211 of the second thin film transistor. In the step S302 above, referring to FIG. 4C, the first insulation layer 23 is formed on the poly-silicon layer, where the first insulation layer 23 optionally includes a plurality of insulation layers, and for example, the first insulation layer 23 can include a gate insulation layer 231, an interlayer insulation layer 232, and a first buffer layer 233, although the first insulation layer 23 will not be limited to any particular structure.

Figure 4C:
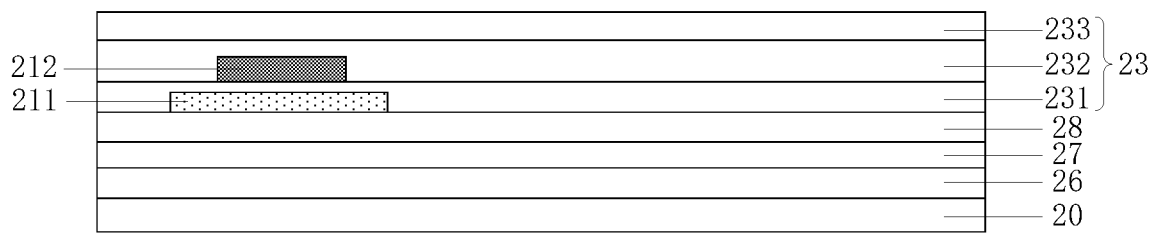
Figure 4D:
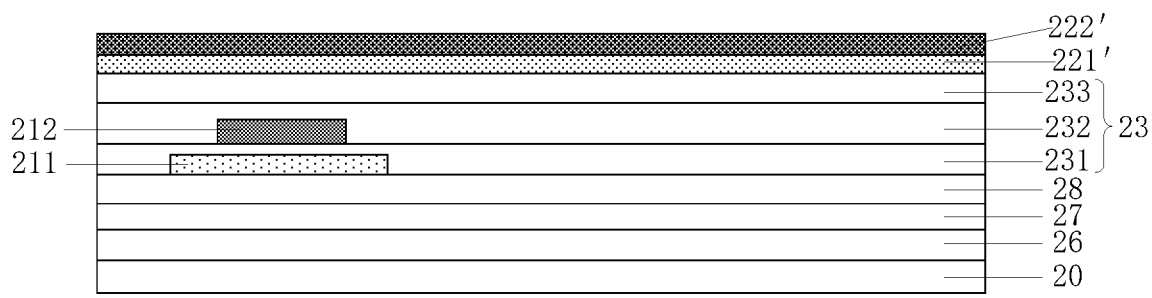

In the step S303 above, referring to FIG. 4D, the semiconductor oxide layer 221' is formed on the first insulation layer 23, where the semiconductor oxide layer is made of a metal oxide semiconductor material, and the first metal layer 222' is formed on the semiconductor oxide layer 221'. In the step S304 above, referring to FIG. 4E, the semiconductor oxide layer and the first metal layer are patterned in one patterning process to form the first active layer 221, the first protection layer 222a and the second protection layer 222b, where the first protection layer 222a is located at the position where the first active layer 221 is to be connected with the source electrode to be formed, and the second protection layer 222b is located at the position where the first active layer 221 is to be connected with the drain electrode to be formed.

Figure 4E:
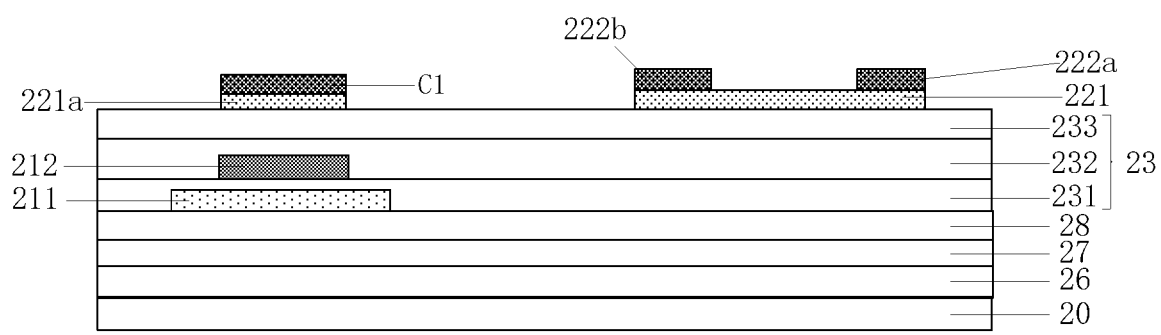
Figure 4F:
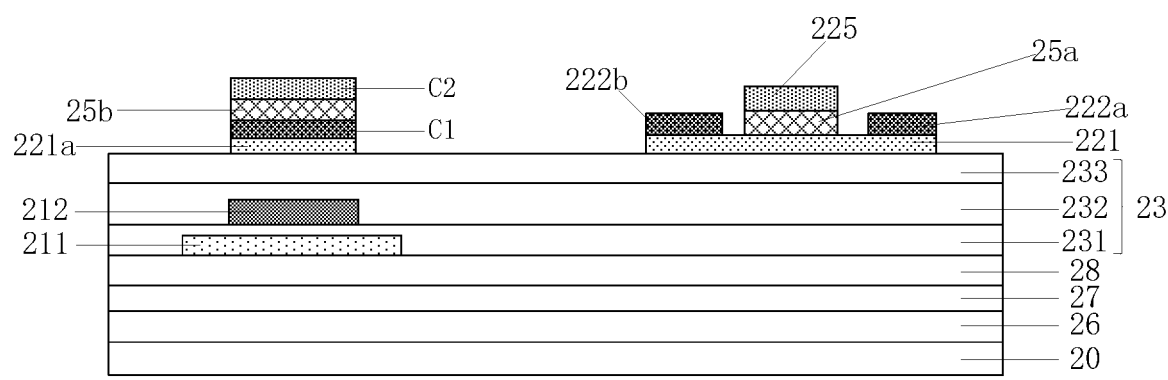
Figure 4G:
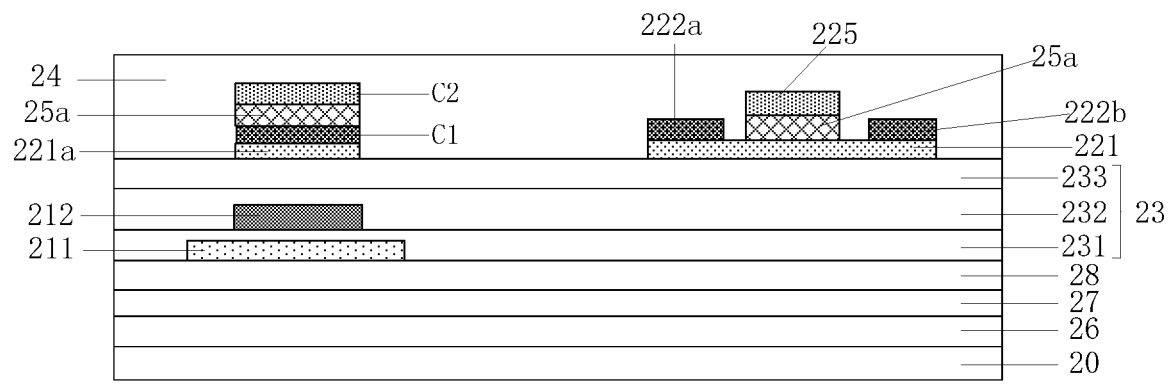
Figure 4H:
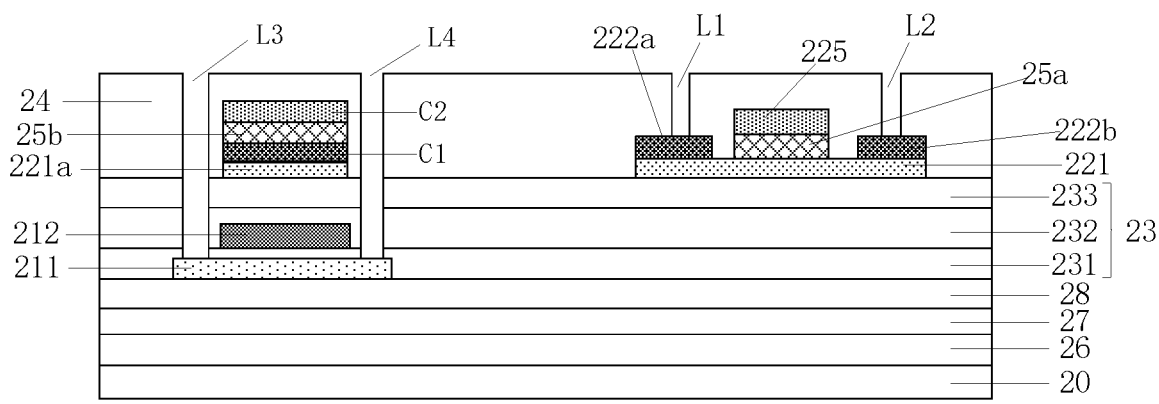

In the step S305 above, referring to FIG. 4G the second insulation layer 24 is formed on the first metal layer (the layer where the first protection layer 222a and the second protection layer 222b are located). In the step S306, referring to FIG. 4H, the first insulation layer 23 and the second insulation layer 24 are patterned in one patterning process to form the first via-hole L1, the second via-hole L2, the third via-hole L3, and the fourth via-hole L4. The first via-hole L1 and the second via-hole L2 run through the second insulation layer 24, and are configured to electrically connect the first protection layer 222a and the second protection layer 222b with the source-drain electrode layer, the third via-hole L3 and the fourth via-hole L4 run through the first insulation layer 23 and the second insulation layer 24, and are configured to electrically connect the second active layer 211 with the source-drain electrode layer; the orthographic projection of the first via-hole L1 on the base substrate 20 lies in the orthographic projection of the first protection layer 222a on the base substrate 20, the orthographic projection of the second via-hole L2 on the base substrate 20 lies in the orthographic projection of the second protection layer 222b on the base substrate, that is, the first active layer 221 is completely shielded by the first protection layer 222a and the second protection layer 222b and thus not exposed at the positions corresponding to the first via-hole L1 and second via-hole L2, and the first and second protection layers 222a, 222b are formed by patterning the first metal layer 222', that is, the first and second protection layers 222a, 222b are made of metal material, so the first and second protection layers made of the metal material cannot be etched by etching solution or an etching device for etching the insulation layer so that the first active layer 221 can be protected from being damaged. In the step S307 above, referring to FIG. 4I, the pattern of the source-drain electrode layer is formed on the second insulation layer 24 to form the first source 223 and the first drain 224 of the first thin film transistor 22, and the second source 213 and the second drain 214 of the first thin film transistor 21, where in the first thin film transistor 22, the first source 223 and the first drain 224 are connected indirectly with the first active layer 221 through the first and second protection layers 222a, 222b, and since the first and second protection layers 222a, 222b are made of the metal material with a high electrical-conductivity, the first source 223 and the first drain 224 can be well connected with the first active layer 221.

In some embodiments, before the step S301 above, referring to FIG. 4A, the method can further include: forming an organic layer 26, an inorganic blocking layer 27, and a second buffer layer 28 on the base substrate 20, where the organic layer 26 can be made of a polyimide (PI) material or another material, although the embodiment of the disclosure will not be limited thereto.

Furthermore the method above according to the embodiment of the disclosure can further include: forming a first electrode C1 in the same one patterning process as the first and second protection layers 222a, 222b as illustrated in FIG. 4E.

Stated otherwise, in the step S404 above, the semiconductor oxide layer and the first metal layer are patterned in one patterning process to form the first active layer 221 of the first thin film transistor, and to form the first electrode C1 in addition to the first and second protection layer 222a, 222b. It shall be noted that since the first metal layer and the semiconductor oxide layer are patterned in one patterning process, and the first metal layer is located on the semiconductor oxide layer, the pattern of the semiconductor oxide layer (that is the first semiconductor oxide layer) is still reserved on the side of the first electrode C1 proximate to the base substrate 20, where this pattern does not affect any other layer or signal line, and thus will not be removed.

Still furthermore in the method above according to the embodiment of the disclosure, after the step S304 above, and before the step S305 above, the method can further include the followings.

A third insulation layer is formed on the first metal layer, and a first gate insulation layer is formed on the first active layer, and a second metal layer is formed on the third insulation layer and the first gate insulation layer.

Referring to FIG. 4F, the third insulation layer 25b and the first gate insulation layer 25a can be formed in one patterning process. That is, the third insulation layer 25b and the first gate insulation layer 25a can be made of the same material. In this way, the fabrication process can be lowered, and the fabrication cost can be lowered.

Referring to FIG. 4F, the first gate insulation layer 25a, the third insulation layer 25b and the second metal layer are patterned to form a first gate 225 of the first thin film transistor, and a second electrode C2, where an orthographic projection of the second electrode C2 on the base substrate 20 overlaps with an orthographic projection of the first electrode C1 on the base substrate 20.

The orthographic projections of the first electrode C1 and the second electrode C2 on the base substrate 20 overlap with each other, so the first electrode C1 and the second electrode C2 constitute a capacitor structure, and since there is only one insulation layer (i.e., the third insulation layer 25b) between the first electrode C1 and the second electrode C2, where the thickness of the third insulation layer 25b only ranges from 1000Å to 1500Å, that is, there is a short distance between the first electrode C1 and the second electrode C2, there is a large capacitance of the constituted capacitor structure. In a real application, the capacitor structure can be a pixel capacitor in a pixel circuit, and the pixel capacitor is formed as the capacitor structure with the large capacitance so that a Driving Thin Film Transistor (DTFT) connected with the pixel capacitor can be so highly reliable that the potential at a gate of the DTFT transistor may drop slowly in a pixel light-emission period to thereby alleviate flicking on the display panel. In a real application, the third insulation layer above can be made of an SiO material, although the third insulation will not be limited to any specific material. In order to save a space, and to avoid any other signal line from being affected, the capacitor structure constituted of the first electrode C1 and the second electrode C2 is optionally located at the position of the second thin film transistor.

In some embodiments, in the method above according to the embodiment of the disclosure, the step S304 above can include: patterning the semiconductor oxide layer and the first metal layer in one patterning process using a half tone mask so that the orthographic projections of the formed first and second protection layers 222a, 222b on the base substrate 20 does not overlap with the orthographic projection of the first gate 225 of the first thin film transistor on the base substrate 20, as illustrated in FIG. 4F.

Since the first active layer 221 is protected by the first and second protection layer 222a, 222b, the first active layer 221 isn't be exposed at the first and second via-hole positions after the via-holes are formed, and since there may be some error while the via-holes are being formed, the orthographic projections of the first and second protection layers 222a, 222b on the base substrate 20 only needs to be slightly larger than the orthographic projections of the first and second via-holes on the base substrate 20; and in order to avoid the first and the second protection layers 222a, 222b from affecting a gate line, optionally the orthographic projections of the formed first and second protection layers 222a and 222b on the base substrate 20 do not overlap with the orthographic projection of the first gate 225 of the first thin film transistor on the base substrate.

In a process flow, the semiconductor oxide layer and the first metal layer are patterned in a half-tone process using the half tone mask, where firstly a photo-resist layer is formed above the first metal layer to shield the pattern to be reserved, and in order to etch the first metal layer at the position of the first gate of the first thin film transistor, and not to etch the first active layer, the photo-resist layer shall be thinner at the position of the first gate of the first thin film transistor, the optical transmittivity of the mask at that position can be controlled.

Figure 4I:
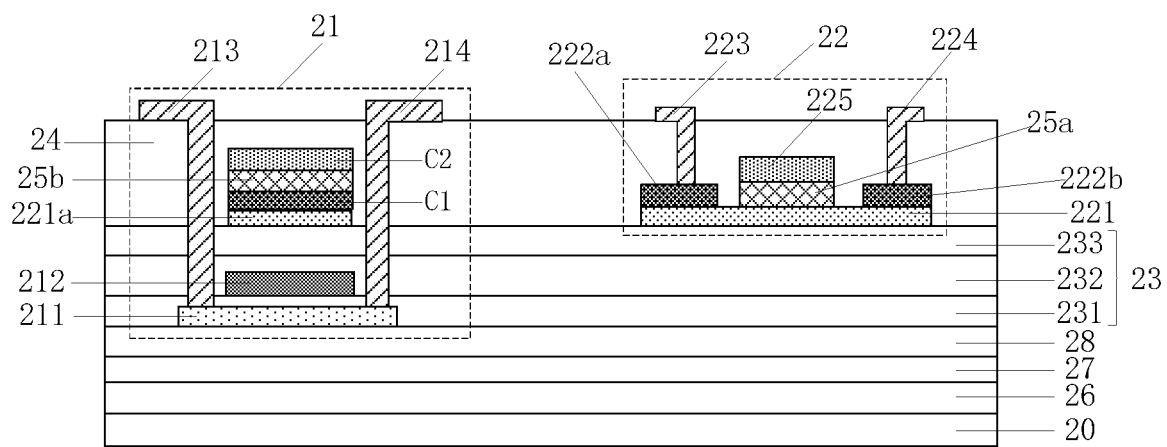

In a real application, before or after the step S301, referring to FIG. 4C, the method can further include: forming a second gate 212 of the second thin film transistor. Stated otherwise, the second thin film transistor can be a thin film transistor with a top gate, or can be a thin film transistor with a bottom gate, although the embodiment of the disclosure will not be limited thereto. Moreover the first thin film transistor can be a thin film transistor with a top gate, or a thin film transistor with a bottom gate. Referring to FIG. 4I, in a specific implementation, the second gate 212 of the second thin film transistor 21, and the first electrode C1 can constitute a capacitor structure, and since there is a thicker insulation layer between the second gate 212 of the second thin film transistor 21, and the first electrode C1, there is a smaller capacitance of the capacitor structure, so when a capacitor structure with a smaller capacitance is as needed in reality, then the capacitor structure may be constituted of the second gate 212 of the second thin film transistor 21, and the first electrode C1.

Specifically in the method above according to the embodiment of the disclosure, forming the semiconductor oxide layer above the first insulation layer in the step S303 above can include: forming the semiconductor oxide layer of an indium gallium zinc oxide (IGZO), indium tin zinc oxide (ITZO), indium gallium zinc tin oxide (IGTO) or zinc oxide (ZnO) material above the first insulation layer. Alternatively the semiconductor oxide layer can be made of another metal oxide semiconductor material, and for example, some other component can be added to the IGZO material to form the semiconductor oxide layer in an IGZXO structure to thereby improve the mobility of carriers, although the semiconductor oxide layer will not be limited to any specific material.

In some embodiments, in the method above according to the embodiment of the disclosure, forming the first metal layer on the semiconductor oxide layer in the step S303 above includes: forming the first metal layer of a Mo or Ti material on the semiconductor oxide layer.

The first and second protection layers are made of metal material so that in the patterning process in the step S306, the first and second protection layer can avoid the first active layer from being exposed, the first and second protection layer cannot be etched so that the first active layer cannot be damaged, and the first and second protection layer can well connect the first active layer with the source-drain electrode layer after the source-drain electrode layer is formed.

In a further aspect, based upon the same inventive idea, an embodiment of the disclosure provides a display panel, and since the display panel addresses the problem under a similar principle to the method above, reference can be made to the implementation of the method above for an implementation of the display panel, and a repeated description thereof will be omitted here.

As illustrated in FIG. 4I, a display panel according to an embodiment of the disclosure includes: a base substrate 20, a second thin film transistor 21 located on the base substrate 20, a first insulation layer 23, a first thin film transistor 22 located on the first insulation layer 23, a second insulation layer 24, a first via-hole L1 and a second via-hole L2 running through the second insulation layer 24, a third via-hole L3 and a fourth via-hole L4 running through the first insulation layer 23 and the second insulation layer 24.

The first thin film transistor 22 includes: a first active layer 221 located on the first insulation layer 23, a first protection layer 222a and a second protection layer 222b located on the first active layer 221, and a first source 223 and a first drain 224 located on the second insulation layer.

The second thin film transistor 21 includes: a second active layer 211 located on the base substrate 20, and a second source 213 and a second drain 214 located on the second insulation layer 24.

The second active layer 212 is connected respectively with the second source 213 and the second drain 214 through the third via-hole L3 and the fourth via-hole L4, and the first protection layer 222a and the second protection layer 222b are connected respectively with the first source 223 and the first drain 224 through the first via-hole L1 and the second via-hole L2.

The orthographic projection of the first via-hole L1 on the base substrate 20 lies in the orthographic projection of the first protection layer 222a on the base substrate 20; and the orthographic projection of the second via-hole L2 on the base substrate 20 lies in the orthographic projection of the second projection layer 222b on the base substrate 20.

In the display panel according to the embodiment of the disclosure, the first and second protection layers are arranged to protect the first active layer so that the first active layer cannot be exposed after the first and second via-holes are formed, and thus cannot be damaged while the via-holes are being formed, so the first, second, third and the fourth via-holes can be formed in one patterning process to thereby dispense with a patterning process; and the first and second protection layers and the first active layer can be formed in the same patterning process without increasing the number of patterning processes. Moreover after the first, second, third, and fourth via-holes are formed, the first and second via-holes can be rinsed using HF solution without damaging the first active layer which is not exposed, so that the number of masks can be reduced, and the process cost can be lowered while guaranteeing the stability of the process, and the performance of the thin film transistor.

Since the first active layer 221 is protected by the first and second protection layers 222a, 222b, the first active layer cannot be exposed at the first and second via-holes after the via-holes are formed, and since there may be some error while the via-holes are being formed, the orthographic projections of the first and second protection layers 222a, 222b on the base substrate 20 need to be slightly larger than the orthographic projections of the first and second via-holes on the base substrate 20.

In some embodiments, in the display panel above according to the embodiment of the disclosure, as illustrated in FIG. 4I, the display panel can further include: a first electrode C1 arranged at the same layer as the first protection layer 222a and the second protection layer 222b, and made of the same material as the first protection layer 222a and the second protection layer 222b.

Stated otherwise, the first and second protection layers 222a, 222b are arranged at the same layer as the first electrode C1, and made of the same material as the first electrode C1, and in a fabrication process, the first electrode C1 can be formed in same one patterning process as the first and second protection layer 222a, 222b to thereby simplify the fabrication process, and lower the fabrication cost.

In some embodiments, in the display panel above according to the embodiment of the disclosure, as illustrated in FIG. 4I, the display panel can further include: a first gate insulation layer 25a and a third insulation layer 25b above the layer where the first active layer 221 is located, and the first gate 225 of the first thin film transistor 22 between the first gate insulation layer 25a and the second insulation layer 24, and a second electrode C2 between the third insulation layer 25b and the second insulation layer 24.

The orthographic projection of the second electrode C2 on the base substrate 20 overlaps with the orthographic projection of the first electrode C1 on the base substrate 20.

In some embodiments, the first gate insulation layer 25a and the third insulation layer 25b can be formed in one patterning process, that is, the first gate insulation layer 25a and the third insulation layer 25b can be the same material.

The first gate 225 and the second electrode C2 can be formed in one patterning process, that is, the first gate 225 and the second electrode C2 can be the same material.

The orthographic projection of the first electrode C1 on the base substrate overlaps with the orthographic projection of the second electrode C2 on the base substrate, so the first electrode C1 and the second electrode C2 constitute a capacitor structure, and since there is only one insulation layer (i.e., the third insulation layer 25b) between the first electrode C1 and the second electrode C2, where the thickness of the third insulation layer 25b only ranges from 1000Å to 1500Å, that is, there is a short distance between the first electrode C1 and the second electrode C2, there is a large capacitance of the constituted capacitor structure. In a real application, the capacitor structure can be a pixel capacitor in a pixel circuit, and the pixel capacitor is formed as the capacitor structure with the large capacitance so that a Driving Thin Film Transistor (DTFT) connected with the pixel capacitor can be so highly reliable that the potential at a gate of the DTFT transistor can drop slowly in a pixel light-emission period to thereby alleviate flicking on the display panel. In a real application, the third insulation layer above can be made of an SiO material, although the third insulation will not be limited to any particular material. In order to save a space, and to avoid any other signal line from being affected, the capacitor structure constituted of the first electrode C1 and the second electrode C2 is optionally located at the position of the second thin film transistor.

The display panel above according to the embodiment of the disclosure can be an Organic Light-Emitting Diode (OLED) display panel, or can be a Liquid Crystal Display (LCD) panel, or can be another type of display panel, although the embodiment of the disclosure will not be limited thereto.

In a further aspect, based upon the same inventive idea, an embodiment of the disclosure further provides a display device including the display panel above according to the embodiment of the disclosure. The display device can be applicable to a mobile phone, a tablet computer, a TV set, a display, a notebook computer, a digital photo frame, a navigator, or any other product or component with a display function. Since the display device addresses the problem under a similar principle to the display panel above, reference can be made to the implementation of the display panel above for an implementation of the display device, and a repeated description thereof will be omitted here.

In the display panel, the method for fabricating the same, and the display device according to the embodiments of the disclosure, the first and the second protection layer are formed at the position where the first active layer is to be connected with the source-drain electrode layer to be formed, so that the first active layer exposed at the first via-hole and second via-hole can be protected, and thus the first, second, third and fourth via-holes can be formed in one patterning process to thereby dispense one patterning process; and the first and the second protection layers and the first active layer can be formed in one patterning process without any additional patterning process so that the number of patterning processes can be reduced, the number of masks can be reduced, and the fabrication cost of the display panel can be lowered, while guaranteeing the stability of the process. Moreover the first electrode C1 is formed in the same one patterning process as the first and second protection layers, and the second electrode C2 is formed in the same one patterning process as the first gate of the first thin film transistor, so that there is such a large capacitance of the capacitor structure constituted of the first electrode C1 and the second electrode C2 that a DTFT can be so highly reliable that the potential at a gate of the DTFT transistor can drop slowly in a pixel light-emission period to thereby alleviate flicking on the display panel.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display panel, comprising:
   a base substrate;
   a first thin film transistor on one side of the base substrate, the first thin film transistor comprising: a first active layer, a first protection layer, a second protection layer, a first source and a first drain;
   wherein the first protection layer and the second protection layer are on one side of the first active layer away from the base substrate, and are separated from each other; and
   the first protection layer and the second protection layer are configured to protect the first active layer from being etched during forming of a via-hole corresponding to the first source and/or a via-hole corresponding to the first drain;
   a first gate insulation layer on the side of the first active layer away from the base substrate, the first gate insulation layer being between the first protection layer and the second protection layer, and separated from the first protection layer and the second protection layer;
   a first gate on one side of the first gate insulation layer away from the base substrate and being electrically insulated from the first protection layer and the second protection layer;
   wherein the display panel further comprises:
      a first insulation layer between the first active layer and the base substrate;
      a first electrode on one side of the first insulation layer away from the base substrate and in a same layer as the first protection layer and the second protection layer;
      a second electrode on one side of the first electrode away from the base substrate;
      wherein the first electrode and the second electrode are configured to be two electrodes of a pixel capacitor in a pixel circuit.

2. The display panel according to claim 1, wherein material of the first electrode is same as material of the first protection layer and the second protection layer.

3. The display panel according to claim 1, wherein material of the second electrode is same as material of the first gate.

4. The display panel according to claim 1, further comprising:
   a third insulation layer between the first electrode and the second electrode;
   wherein material of the third insulation is same as material of the first gate insulation layer.

5. The display panel according to claim 1, further comprising:
   a second thin film transistor on the side of the base substrate having the first thin film transistor, the second thin film transistor comprising a second gate;

wherein an orthographic projection of the first electrode on the base substrate at least partially overlaps with an orthographic projection of the second gate on the base substrate; or an orthographic projection of the second electrode on the base substrate at least partially overlaps with the orthographic projection of the second gate on the base substrate.

6. The display panel according to claim 5, wherein the orthographic projection of the second gate on the base substrate is within the orthographic projection of the first electrode on the base substrate; and the orthographic projection of the second gate on the base substrate is within the orthographic projection of the second electrode on the base substrate.

7. The display panel according to claim 6, wherein the orthographic projection of the first electrode and the orthographic projection of the second electrode on the base substrate completely overlap with each other.

8. The display panel according to claim 5, further comprising: a second insulation layer on one side of the first insulation layer away from the base substrate, and the second thin film transistor further comprising: a second active layer, a second source, a second drain, and a third via-hole in the first insulation layer and the second insulation layer, wherein the second active layer is electrically connected with the second source of the second thin film transistor through the third via-hole.

9. The display panel according to claim 8, further comprising: a fourth via-hole in the first insulation layer and the second insulation layer, wherein the second active layer is electrically connected with the second drain of the second thin film transistor through the fourth via-hole.

10. The display panel according to claim 1, further comprising:

a second insulation layer on one side of the first insulation layer away from the base substrate; and a first via-hole in the second insulation layer;

wherein the first protection layer is electrically connected with the first source through the first via-hole.

11. The display panel according to claim 10, further comprising: a second via-hole in the second insulation layer, wherein the second protection layer is electrically connected with the first drain through the second via-hole.

12. The display panel according to claim 1, wherein the first protection layer and the second protection layer are metal layers.

13. The display panel according to claim 1, wherein the first active layer is a semiconductor oxide layer.

14. A method for fabricating the display panel of claim 1, comprising:

forming a first active layer of a first thin film transistor on the first active layer, and forming a first protection layer and a second protection layer on the first active layer, wherein the first protection layer and the second protection layer are separated from each other, and are configured to protect the first active layer from being etched during forming of a via-hole corresponding to a first source of the first thin film transistor and/or a via-hole corresponding to a first drain of the first thin film transistor.

15. The method according to claim 14, wherein before forming the first active layer of the first thin film transistor on the first active layer the method further comprises:

forming a first insulation layer on one side of the base substrate;

wherein before forming the first insulation layer on one side of the base substrate, the method further comprises:

forming a pattern of a poly-silicon layer on the base substrate to form a second active layer of a second thin film transistor;

forming the first insulation layer on the poly-silicon layer;

and after forming the first protection layer and the second protection layer, the method further comprises:

forming a second insulation layer on the first protection layer and the second protection layer;

patterning the first insulation layer and the second insulation layer in one patterning process to form a first via-hole and a second via-hole running through the second insulation layer and a third via-hole and a fourth via-hole running through the first insulation layer and the second insulation layer;

forming a pattern of the source-drain electrode layer on the second insulation layer to form a first source and a first drain of the first thin film transistor, and a second source and a second drain of the second thin film transistor, wherein the first source and the first drain are electrically connected with the first protection layer and the second protection layer respectively through the first via-hole and the second via-hole, the second source and the second drain are electrically connected with the second active layer respectively through the third via-hole and the fourth via-hole.

16. The method according to claim 15, further comprising:

forming a first electrode in a same patterning process as the first protection layer and the second protection layer.

17. The method according to claim 16, further comprising:

forming a first gate insulation layer of the first thin film transistor on the first active layer, wherein the first gate insulation layer is between the first protection layer and the second protection layer, and separated from the first protection layer and the second protection layer, forming a third insulation layer on the first electrode at same time when forming the first gate insulation layer, wherein the third insulation layer and the first gate insulation layer are formed in one patterning process;

forming a first gate of the first thin film transistor on the first gate insulation layer, and forming a second electrode on the third insulation layer, wherein the first gate and the second electrode are formed in one patterning process.

18. The method according to claim 14, wherein forming the first active layer of a first thin film transistor on the first active layer and forming the first protection layer and the second protection layer on the first active layer comprises:

forming a semiconductor oxide layer on the first insulation layer, and forming a first metal layer on the semiconductor oxide layer;

patterning the semiconductor oxide layer and the first metal layer in one patterning process to form the first active layer of the first thin transistor and the first protection layer and the second protection layer on the first active layer.

* * * * *